(12) United States Patent
Kamata

(10) Patent No.: US 8,267,578 B2
(45) Date of Patent: Sep. 18, 2012

(54) METHODS AND SYSTEMS FOR TEMPERATURE COMPENSATED TEMPERATURE MEASUREMENTS

(75) Inventor: Masahiro Kamata, Kawasaki (JP)

(73) Assignee: Schlumberger Technology Corporation, Sugar Land, TX (US)

( * ) Notice: Subject to any disclaimer, the term of this patent is extended or adjusted under 35 U.S.C. 154(b) by 711 days.

(21) Appl. No.: 12/365,889

(22) Filed: Feb. 4, 2009

(65) Prior Publication Data

US 2010/0198546 A1 Aug. 5, 2010

(51) Int. Cl.
*G01K 7/16* (2006.01)
*G01K 7/21* (2006.01)
*G01K 13/00* (2006.01)

(52) U.S. Cl. .. 374/136; 374/143; 374/185; 374/E13.001

(58) Field of Classification Search .............. 374/117, 374/136, 143, 163, 183, 185, E13.001, E15.001; 702/99
See application file for complete search history.

(56) References Cited

U.S. PATENT DOCUMENTS

| | | | | |
|---|---|---|---|---|
| 3,541,857 A * | 11/1970 | Massey | | 374/172 |
| 3,892,281 A | 7/1975 | Brown | | |
| 4,881,406 A * | 11/1989 | Coury | | 73/152.03 |
| 4,893,505 A * | 1/1990 | Marsden et al. | | 73/152.24 |
| 5,722,772 A * | 3/1998 | Keil et al. | | 374/45 |
| 7,270,476 B2 * | 9/2007 | Tokita et al. | | 374/107 |
| 7,299,090 B2 * | 11/2007 | Koch | | 600/547 |
| 7,374,336 B2 * | 5/2008 | Fraden | | 374/208 |
| 7,447,607 B2 * | 11/2008 | Schuh et al. | | 702/130 |
| 7,539,593 B2 * | 5/2009 | Machacek | | 702/127 |
| 7,914,204 B2 * | 3/2011 | Kim et al. | | 374/120 |
| 2007/0268953 A1 * | 11/2007 | Price | | 374/1 |
| 2011/0299562 A1 * | 12/2011 | Hashemian | | 374/1 |
| 2012/0051389 A1 * | 3/2012 | Schalles et al. | | 374/1 |

FOREIGN PATENT DOCUMENTS

| | | |
|---|---|---|
| EP | 1498713 | 7/2004 |
| GB | 1311405 | 3/1973 |
| WO | WO 2009047812 A1 * | 4/2009 |

OTHER PUBLICATIONS http://en.wikipedia.org/wiki/Constantan, as printed from the website on May 14, 2009.
http://www.koaproducts.com/english/catalogue/sdt101.htm,as printed from the website on May 14, 2009.

* cited by examiner

*Primary Examiner* — R. A. Smith
(74) *Attorney, Agent, or Firm* — Jianguang Du; Jody DeStefanis

(57) ABSTRACT

Methods and systems for compensating temperature measurements by a temperature gauge comprising a first temperature sensor and a second reference temperature sensor, having different thermal properties, located in the same temperature environment to be measured. The methods and systems compensate for errors in the measured temperatures due to variations in the reference sensor caused by temperature effects.

17 Claims, 17 Drawing Sheets

Material whose temperature needs to be measured.

Material whose temperature needs to be measured.

METHODS AND SYSTEMS FOR TEMPERATURE COMPENSATED TEMPERATURE MEASUREMENTS

BACKGROUND

The present disclosure relates generally to methods and systems having temperature transducers or sensors for the measurement of temperatures where high precision is required or in extreme temperature environments such as oil wells. More specifically, some aspects disclosed herein are directed to methods and systems for correcting errors in temperature measurements. The methods and systems provide compensation for errors in temperature measurements due to variations in the measuring instruments that are caused by elevated temperatures.

Resistance Temperature Detectors (RTD) are temperature transducers that utilize, for example, platinum wire resistance elements to measure temperature. One example of such a temperature transducer is shown schematically in FIG. 1. RTDs having thin film resistance elements are also known in the art. As the element becomes hot, the value of the electrical resistance increases. In this, it is possible to correlate the resistance of the element with temperature. Since the element is made from a pure material whose resistance at various temperatures is known, temperature measurements are possible based on a predictable change in resistance of the element as temperature changes.

Typically, the element has a length of wire, such as platinum wire, that is wound around a core of ceramic or glass. Note again FIG. 1. A sheath or pipe of glass, for example, encapsulates the fragile element to form a probe type temperature gauge. Such probes are used for temperature sensing and measurement with an external indicator, controller or transmitter, or enclosed inside other devices where they measure temperature as a part of the device's function, such as a temperature controller or precision thermostat.

The lead wires used to connect the RTD to an external display can contribute to measurement error, especially when long lead lengths are involved because of voltage drop across the long lead wires. In particular, such errors are evident in remote temperature measurement locations. It is possible to minimize or limit such errors by the use of 3-wire and 4-wire designs.

Temperature gauges having RTDs that are used for precision measurements of temperature are connected to an instrument to read the resistance of the sensing RTD $R_t$. Note FIG. 2A. The instrument also measures the amount of current to be injected to the RTD $R_t$. In this, a reference resistance $R_r$ is located in the instrument to provide reference resistance measurements for purposes of determining the temperature(s) T at which the sensing RTD $R_t$ is located. People normally assume that the temperature of the instrument (more precisely, the temperature of the reference resistance $R_r$) does not vary, or the variation is very small, in the temperature range of the operation of the instrument.

To measure the resistance of a RTD, the instrument injects current into the RTD. Then, the voltage across the RTD is measured. It is known that current injection into a resistance causes heat dissipation, and the temperature of the RTD may change. A typical resistance of a RTD is 100 ohm. The temperature measurement instrument normally injects 1 mA to the RTD. Such an instrument can also change the injection current, say to 1.4 mA. If the resistance of a RTD measured with a higher current is higher than the resistance that is measured with a normal, i.e., lower, current, it is assumed that the current injection is heating the RTD element. Thus by changing the amount of current it is possible to provide quality control of the temperature measurements.

It is also known that there may be thermo-electric effects (also known as Peltier effects) present in the temperature measurements. The RTD is possibly made of platinum, and the lead wires may be of copper. Any junction of different metallic materials may cause thermoelectricity. The thermoelectricity causes errors in the RTD resistance determination. The temperature measurement instrument is usually capable of changing the polarity of the measurement, i.e., to apply a negative current. By combining two measurements in positive and negative currents, the instrument compensates for the thermo-electric effects.

Temperature gauges utilizing quartz crystal are also known in the art. The natural frequency of a quartz oscillator is a function of temperature. By counting the cycles of oscillation, the temperature of the quartz may be determined. To count the frequency, there should be a time reference. The time reference may be made with another quartz that is insensitive to temperature; however, there is still some temperature dependency. The error may not be negligible if high precision is required, or if the environmental temperature of the reference quartz is high.

In addition to the foregoing, the specifications that typical temperature measurement instruments of the type described herein currently have are accuracy of 0.01 degrees Celsius and resolution of 0.001 degrees Celsius. In certain circumstances, the actual temperature measurement errors as described hereinafter may exceed the instruments' specifications.

In view of the foregoing, applicant recognized a need for improved methods and systems for temperature measurements requiring precision. Specifically, there is need for improved techniques for measuring temperature that compensate for errors that are caused due to temperature effects on the measuring devices. In this, one object of the present disclosure is to provide an improved mechanism for precise measurements of temperature. Another object of the present disclosure is to enable temperature compensated temperature measurements for high precision and/or for extreme temperature applications, such as oil wells. The present disclosure also shows how to compensate for heat dissipation by switching current.

SUMMARY OF THE DISCLOSURE

The disclosure herein may meet at least some of the above-described needs and others. In consequence of the background discussed above, the applicant recognized a need for methods and systems for measuring temperature in a reliable, efficient manner. The present disclosure provides methods and systems for compensating for errors in temperature measurements by locating at least two transducers, one for sensing the ambient temperature and the other as a reference sensor, in the same environment where the temperature is to be measured. The two transducers have different thermal properties, such as different coefficients of electrical conductivity ("thermal coefficients") or different variations in resonant frequencies due to temperature, to eliminate errors in temperature measurements due to temperature effects.

In one aspect of the present disclosure, a method for compensating temperature measurements by a temperature gauge comprises providing a first temperature sensor and a second reference temperature sensor in a temperature gauge. The first and second temperature sensors have different thermal properties and the temperature gauge is configured or designed so that the first and second temperature sensors are located in the same ambient temperature to be measured. At least one temperature value is measured simultaneously by the first and second temperature sensors of the temperature gauge and one or more compensated temperature values are derived based on the measured temperature value and the thermal properties of the first and second temperature sensors.

In some aspects of the present disclosure, the first and second temperature sensors comprise resistance temperature detectors (RTD) having different thermal coefficients. The first resistance temperature detector may comprise platinum and the second reference resistance temperature detector may comprise constantan.

In other embodiments herein, the first and second temperature sensors comprise quartz crystal temperature transducers having different cuts and the compensated temperature values may be calculated from resonant frequencies of the quartz crystal temperature transducers having different cuts.

In yet other embodiments of the present disclosure, the first and second temperature sensors may comprise platinum wire and constantan wire imbedded in an electrically insulated film substrate. The first and second temperature sensors may be attached to a surface of a pressure gauge. The temperature gauge may be configured or designed for operating in oil wells and/or in locations where ambient room temperature environment is unavailable.

In aspects of the present disclosure, a system for temperature measurements by a temperature gauge comprises a first temperature sensor and a second reference temperature sensor in a temperature gauge, wherein the first and second temperature sensors have different thermal properties. The temperature gauge is configured or designed so that the first and second temperature sensors are located in the same ambient temperature to be measured. The system includes a computer in communication with the temperature gauge and a set of instructions that, when executed, derive at least one compensated temperature value based on at least one temperature value, measured simultaneously by the first and second temperature sensors of the temperature gauge, and the thermal properties of the first and second temperature sensors. The temperature gauge may be configured or designed for precision temperature measurements in environments where ambient room temperature environment is unavailable.

In yet other embodiments of the present disclosure, a temperature gauge is provided comprising a plurality of temperature sensors and the temperature gauge is configured or designed for sensing temperature at a plurality of locations on a body.

In further aspects herein, a method is provided for compensating temperature measurements by a temperature gauge for heat dissipation effects.

In embodiments described herein, the compensated temperature values are derived over a period corresponding to a temperature change in the temperature environment to be measured. In aspects of the present disclosure, the first and second temperature sensors may be attached to a surface of another sensor or device whose temperature needs to be know in high accuracy, such as a high precision clock, a pH gauge, a reference resistance, a strain gauge, a density gauge, a thermo-couple, or a pressure gauge, especially when high precision is required and/or when they are used in non-room temperature and/or non-atmospheric pressure environments, such as in oil wells, in outer space, on other planets, in the Arctic, at elevated levels such as high mountains, in deserts, or undersea.

In other embodiments of the present disclosure, a temperature gauge comprises a first temperature sensor and a second reference temperature sensor, wherein the first and second temperature sensors have different thermal properties; and the temperature gauge is configured or designed so that the first and second temperature sensors are located in the same ambient temperature to be measured.

Additional advantages and novel features will be set forth in the description which follows or may be learned by those skilled in the art through reading the materials herein or practicing the principles described herein. Some of the advantages described herein may be achieved through the means recited in the attached claims.

THE DRAWINGS

The accompanying drawings illustrate certain embodiments and are a part of the specification. Together with the following description, the drawings demonstrate and explain some of the principles of the present invention.

Figure 1:
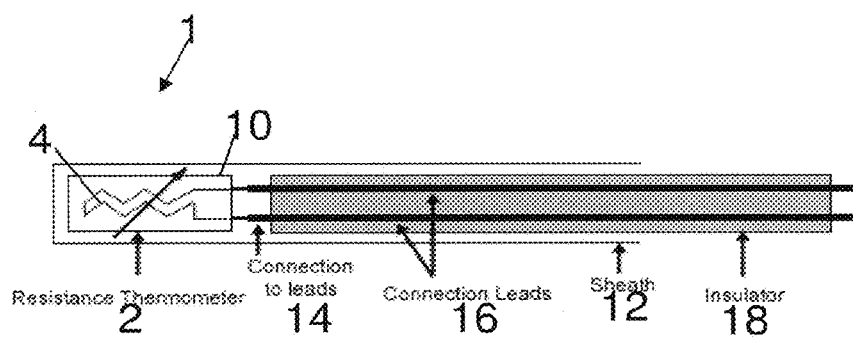
FIG. 1 is a schematic representation of one exemplary temperature gauge having a resistance temperature detector (RTD).

Throughout the drawings, identical reference numbers and descriptions indicate similar, but not necessarily identical elements. While the principles described herein are susceptible to various modifications and alternative forms, specific embodiments have been shown by way of example in the drawings and will be described in detail herein. However, it should be understood that the invention is not intended to be limited to the particular forms disclosed. Rather, the invention includes all modifications, equivalents and alternatives falling within the scope of the appended claims.

DETAILED DESCRIPTION

Illustrative embodiments and aspects of the invention are described below. It will of course be appreciated that in the development of any such actual embodiment, numerous implementation-specific decisions must be made to achieve the developers' specific goals, such as compliance with system-related and business-related constraints, that will vary from one implementation to another. Moreover, it will be appreciated that such development effort might be complex and time-consuming, but would nevertheless be a routine undertaking for those of ordinary skill in the art having the benefit of this disclosure.

Reference throughout the specification to "one embodiment," "an embodiment," "some embodiments," "one aspect," "an aspect," or "some aspects" means that a particular feature, structure, method, or characteristic described in connection with the embodiment or aspect is included in at least one embodiment of the present invention. Thus, the appearance of the phrases "in one embodiment" or "in an embodiment" or "in some embodiments" in various places throughout the specification are not necessarily all referring to the same embodiment. Furthermore, the particular features, structures, methods, or characteristics may be combined in any suitable manner in one or more embodiments. The words "including" and "having" shall have the same meaning as the word "comprising."

Moreover, inventive aspects lie in less than all features of a single disclosed embodiment. Thus, the claims following the Detailed Description are hereby expressly incorporated into this Detailed Description, with each claim standing on its own as a separate embodiment of this invention.

Referring to FIG. 1, a resistor type temperature transducer 1 has a resistance element 2. For example, the resistance element 2 may have a thin wire resistance element 4. The resistance element 4 may be a wire, such as a platinum wire, having a large resistance-temperature coefficient. The resistance element 4 may be wound or otherwise mounted on, for example, a thin, elongated glass pipe 10. The mounted resistance element 4 may be accommodated in a protection pipe 12. The pipe 10 may be made of glass or a ceramic material. The protection pipe 12 may be made of stainless steel, for example. An insulating tube (not shown) for insulating the resistance element 4 and protection pipe 12 from each other may made of polyimide or the like. The resistance element 4 is connected by relay connection wires 14 with external lead lines 16. A metal pipe 18, for example, holds the external lead lines 16 and may be filled with a suitable filler. Other protecting and/or insulating elements may be provided as desirable or necessary. Since such structures and configurations are known to those skilled in the art they are not described in detail in the present disclosure.

The protection pipe 12 and metal pipe 18 are connected to each other by charging the filler. More specifically, the filler seals the protection pipe 12 and fixes the relay connection wires 14 and external lead lines 16 simultaneously. The relay connection wires 14 may be connected to the resistance element 4 through, for example, spot welding portions and may be connected to the external lead lines 16 with solder, for example.

Figure 2A:
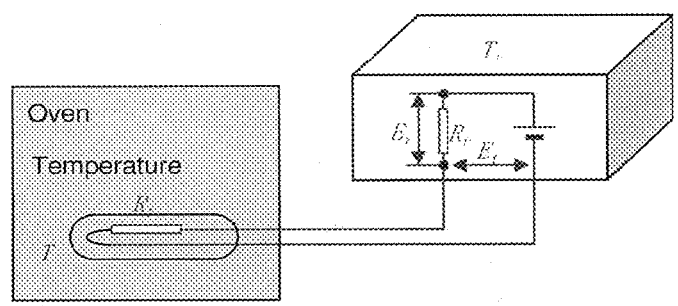
FIGS. 2A and 2B are schematic depictions of some exemplary contexts for temperature measurements to explain the temperature measurement principles discussed in the present disclosure.

FIG. 2A is a schematic depiction of a typical temperature measurement method by using a RTD. The RTD $R_t$ is located, for example, in an oven where the temperature is of interest. An instrument is located outside the oven and measures the resistance of the RTD $R_t$. Typically, a reference resistance $R_r$ is provided for measurement of the injection current and, for example, is located in a measurement instrument at room temperature. Only the sensing transducer is located where the temperature is to be measured. For example, in a laboratory a platinum wire transducer is placed where the temperature needs to be measured, such as in an oven as shown in FIG. 2A. An external indicator or instrument which has a built in reference resistance element is normally placed in a room at room temperature.

The measurement instrument injects current via its reference resistance $R_r$ into the RTD $R_t$ and measures the voltage across the RTD $R_t$. The resistance of the RTD $R_t$ increases as the oven temperature increases. Then the voltage across the RTD $R_t$ becomes larger and drives the needle of the external indicator. As long as the temperature of the external indicator/instrument is stable, the external indicator indicates the amount of RTD resistance $R_t$.

Figure 2B:
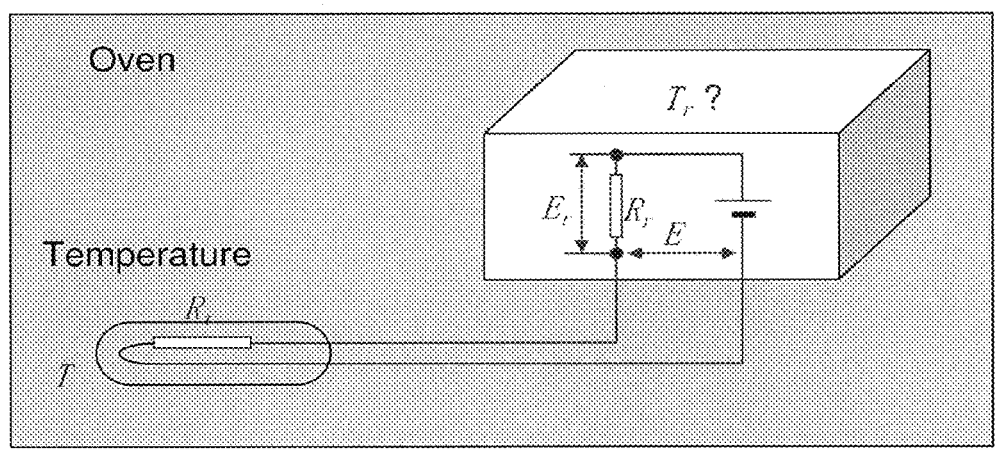

In a borehole application, for example, the recording or external instrument also may be located downhole where the temperature can be high. The situation may be similar to placing the external instrument in the same oven as the transducer element, as shown schematically in FIG. 2B. In such circumstances, it is difficult to determine how the reference resistance behaves, and it is not easy to precisely measure the temperature.

Figure 2C:
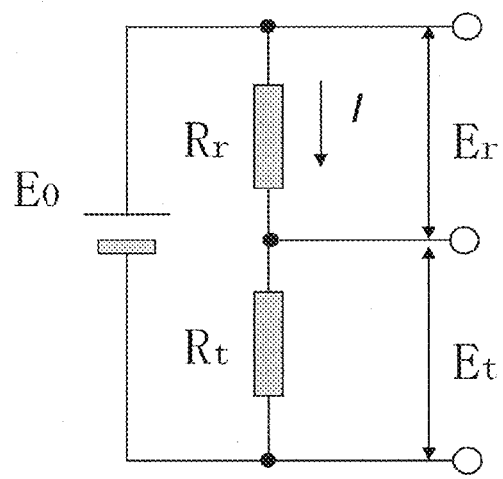
FIG. 2C is a circuit diagram for one temperature measurement system.

One simple configuration for a temperature transducer is shown in FIG. 2C having a reference resistance $R_r$ and a battery. The current is injected to the RTD $R_t$ via a reference resistor as shown in FIG. 2C. The current I is determined by measuring the voltage across the reference resistor $R_r$.

$$I = \frac{E_r}{R_r}$$

Then the RTD resistance $R_t$ is determined from the voltage across the RTD and the injected current as:

$$R_t = \frac{E_t}{I} = \frac{E_t}{E_r} R_r$$

The platinum wire resistance $R_t$ at temperature T can be estimated from the voltage $E_t$ and the current flowing from the battery into the platinum wire and the reference resistance $R_r$. The current is estimated by measuring the voltage across the reference resistance $R_r$. The resistance of the platinum wire $R_t$ is approximated by a second order polynomial as:

$$R_t = R_p\{1 + C_1(\Delta T) + C_2(\Delta T)\} \quad \text{Equation 1}$$

where $C_1 = 0.356297 \times 10^{-2}$ and $C_2 = -0.617945 \times 10^{-6}$, $\Delta T$ is the temperature difference between the temperature T and a reference temperature usually at 20 degrees Celsius, and $R_p$ is the resistance of the platinum wire at 20 degrees Celsius.

For precision temperature measurements, the temperature measurement instrument with the reference resistance should be isolated from any heat dissipation, such as from an oven, so as not to pick up any thermal perturbation from active elements. Note again FIG. 2A. If the instrument is located at a distance from the sensing transducer, the resistance of the connecting cable wire may not be ignored. The measurement of $E_t$ includes the voltage drop on the cable caused by current I that is equal to $2IR_c$, where $R_c$ is the resistance of the cable and "2" denotes a round trip cable. In this, the cable wire resistance is also temperature dependent.

Figure 3A:
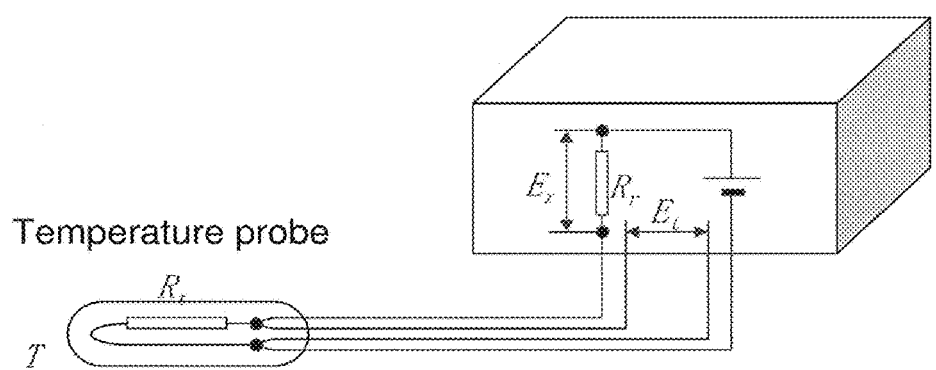
FIG. 3A is a schematic depiction of one instrument for compensating temperature measurements and FIG. 3B is a circuit diagram for the temperature measurement system of FIG. 3A.
Figure 3B:
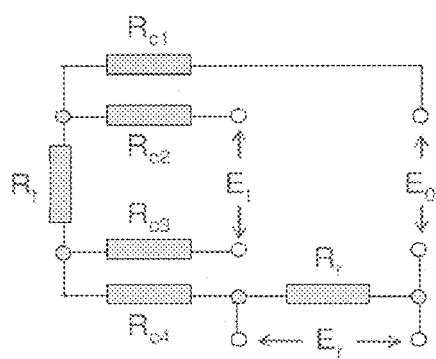

One method to compensate for such a situation is to use four wires as illustrated in FIGS. 3A and 3B. The current flows through cable resistances $R_{c1}$ and $R_{c4}$ and creates voltage drop across the cables. Note FIG. 3B. The voltage $E_t$ across sensor resistance $R_t$ is measured through independent cable wires $R_{c2}$ and $R_{c3}$. The input resistance of the instrument to measure $E_t$ should be much larger than $R_{c2}$, $R_{c3}$ and $R_t$. The current is determined from the voltage $E_r$ across the reference resistance $R_r$.

It is known that constantan has a stable resistance with a very small temperature coefficient, $C_0=0.00001$. In this, constantan is one material that is suitable for purposes of a reference resistance transducer. For a given temperature T, the reference resistance, $R_r$, obtained by using constantan is:

$$R_r = R_c\{1 + C_0(\Delta t)\} \quad \text{Equation 2}$$

where $R_c$ is the resistance at a reference temperature, such as 20 degrees Celsius.

Assume that the resistances for reference $R_r$ and platinum $R_t$ are 100 ohms and the supply voltage $E_0$ is 1 V. The resistances of the reference $R_r$ and platinum $R_t$ at 120 degrees Celsius and temperature calculated from those resistances may be estimated by using Equations 1 and 2 as shown in Table 1 below. The calculation based on an ideal reference resistance is shown in the column, "ideal", and the calculation based on a constantan reference resistance is shown in the "constantan" column. In the "constantan" column, the temperature is calculated by assuming constantan does not have any temperature dependence.

TABLE 1

| | Temperature estimation | |
|---|---|---|
| | Ideal | Constantan |
| C0 [1/° C.] | 0 | 0.00001 |
| C1 [1/° C.] | | 3.56297E-03 |
| C2 [1/° C.^2] | | -6.17945E-07 |
| T [° C.] | 120 | 120 |
| Rr [ohm] | 100 | 100.12 |
| Rt [ohm] | 141.865799 | 141.865799 |
| Et [V] | 0.58654758 | 0.58625671 |
| T [° C.] | 120 | 119.50209 |
| Error [° C.] | 0 | -0.4979103 |

The constantan reference resistance $R_r$ becomes 100.12 ohms at 120 degrees Celsius. The temperature that is calculated from the measured voltage $E_t$ of the sensing resistance $R_t$ by using the constantan reference is then 119.502 degrees Celsius. The error compared to an ideal reference, i.e., one that does not have temperature effects, or original temperature is -0.498 degrees Celsius. The error is about 0.5 degrees Celsius, which is more than the margin of error of 0.01 degrees Celsius that is required in precision measurements. This is the result of placing the instrument with the reference resistance $R_r$ in an oven with the sensing transducer $R_t$. Note FIG. 2B.

Figure 2D:
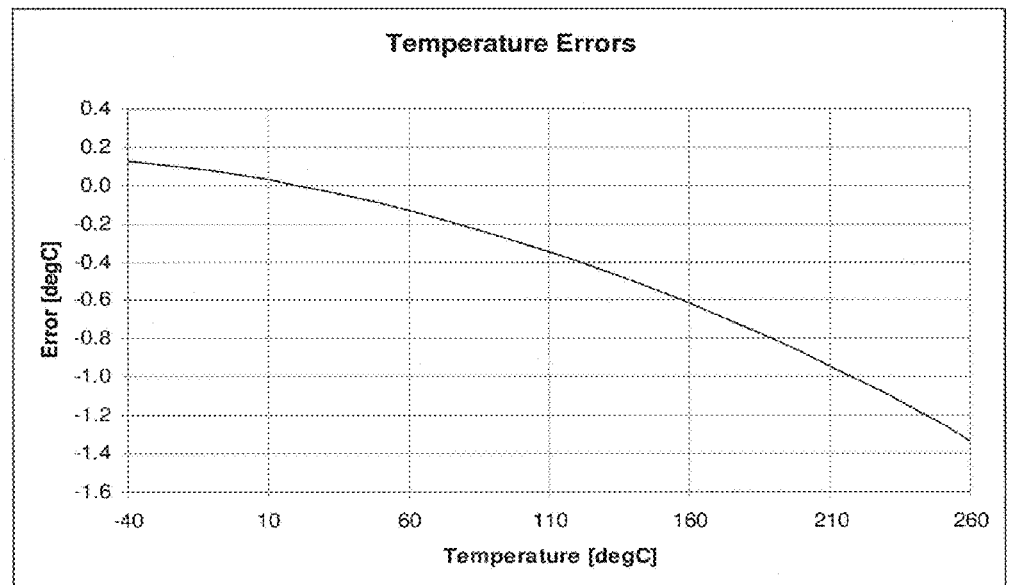
FIG. 2D is a graph depicting errors from temperature measurements using an uncompensated reference sensor as a function of temperature.

In the graph of FIG. 2D, the error from the uncompensated reference sensor is shown as a function of temperature. It is seen that the temperature accuracy is not in the order of magnitude normally shown in the specification of temperature gauges, such as 0.01 degrees Celsius. Such accuracy is only true for room temperature between 15 and 25 degrees Celsius.

The present disclosure provides improved techniques for solving problems such as those discussed above. In particular, some of the embodiments herein provide mechanisms for compensating temperature measurements for errors that might be introduced in the measurements due to the reference transducer. For example, when it is not feasible to locate the reference sensor in a room temperature environment it is possible that temperature measurement errors will arise due to temperature effects on the reference sensor.

Figure 4A:
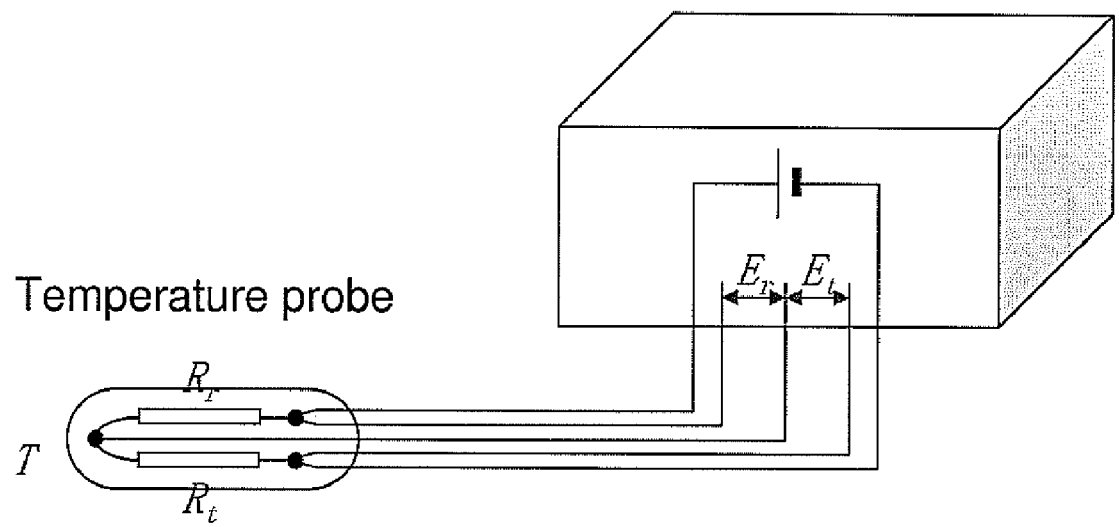
FIG. 4A is a schematic depiction of one possible temperature compensated temperature measurement system according to the present disclosure and FIG. 4B is a circuit diagram for the temperature transducer configuration according to FIG. 4A.
Figure 4B:
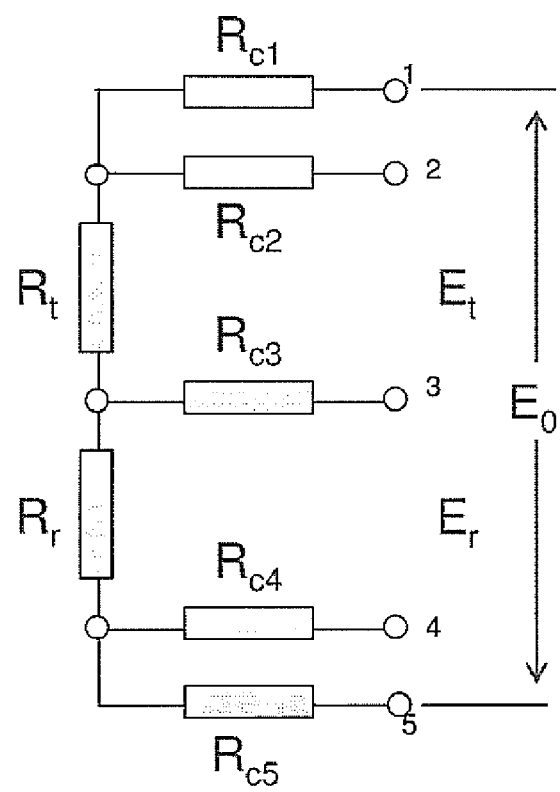

Applicant has proposed modifying the 4-wire circuit of FIGS. 3A and 3B to adapt it for placement of a reference sensor $R_r$ so that the reference sensor is located at the same place and ambient temperature as the temperature sensing element $R_t$. The proposed circuit is shown in FIGS. 4A and 4B.

Figure 4C:
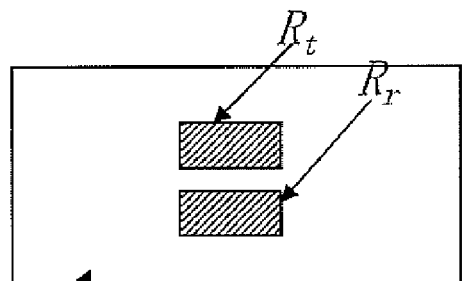
FIGS. 4C to 4E are schematic depictions of some possible configurations for temperature transducers according to the present disclosure.
Figure 4D:
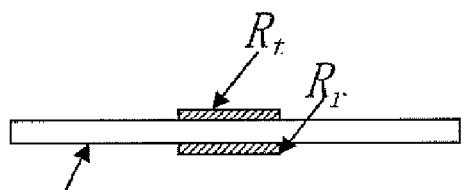
Figure 4E:
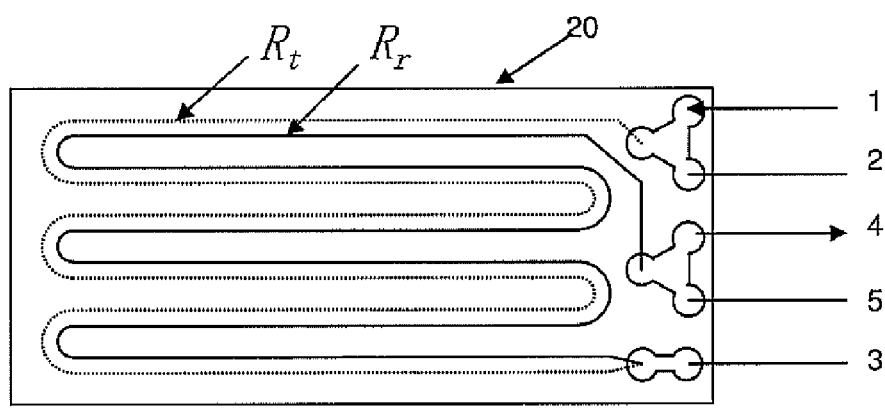

FIGS. 4C to 4E show some possible configurations of temperature transducers having reference resistors according to the present disclosure. FIG. 4E is a schematic representation of a thin film type RTD having a platinum wire sensing element $R_t$ and a constantan wire reference element $R_r$ that are embedded in a suitable substrate 20 such as an electrically insulated thin film substrate.

Applicant has proposed novel methodology in which the reference resistance $R_r$, for example, a constantan reference resistance is located at the same place as the measuring resistance $R_t$, for example, a platinum sensing element, and both resistances are maintained so that their temperatures are the same. Then, the voltage $E_r$ across the reference resistance is measured.

$$E_r = IR_r$$

Since the current flowing in the reference resistance $R_r$ and the current flowing in the sensing resistance $R_t$ are the same, $$I = \frac{E_r}{R_r} = \frac{E_t}{R_t}$$

Therefore, it is possible to combine Equations 1 and 2. The result is:

$$\frac{R_c}{E_r}\{1 + C_0(\Delta T)\} = \frac{R_p}{E_t}\{1 + C_1(\Delta T) + C_2(\Delta T)^2\} \quad \text{Equation 3}$$

The temperature T can be determined by satisfying Equation 3. For the simplest case, $C_2=0$ or $C_2$ is very small, $$\frac{R_c}{E_r}\{1 + C_0(\Delta T)\} = \frac{R_p}{E_t}\{1 + C_1(\Delta T)\} \quad \text{Equation 4}$$

Then the temperature may be found as:

$$\Delta T = \frac{\frac{E_t}{E_r}\frac{R_c}{R_p} - 1}{C_1 - C_0 \frac{E_t}{E_r}\frac{R_c}{R_p}} \quad \text{Equation 5}$$

If $C_2$ cannot be ignored, $$\left(1 - \frac{R_c E_t}{R_p E_r}\right) + \left(C_1 - C_0 \frac{R_c E_t}{R_p E_r}\right)(\Delta T) + C_2(\Delta T)^2 = 0 \quad \text{Equation 6}$$

Then a solution is found as:

$$(\Delta T) = \frac{-\left(C_1 - C_0 \frac{R_c E_t}{R_p E_r}\right) + \sqrt{\left(C_1 - C_0 \frac{R_c E_t}{R_p E_r}\right)^2 - 4C_2\left(1 - \frac{R_c E_t}{R_p E_r}\right)}}{2C_2} \quad \text{Equation 7}$$

If higher order polynomials for the thermal coefficients for platinum and constantan are available, Equation 3 may be flintier expanded to higher order equations for improved accuracy. It is noted that both the constantan reference and platinum sensor should be placed or configured so that their temperatures are the same.

The temperature coefficients may not be in a polynomial form or even in higher order polynomials in such a case, a closed form solution or an analytical solution may not exist; however, compensated temperatures may be computed as long as the thermal coefficients are obtained from the element specifications or by calibrating the transducer elements. In general for a RTD, the current is $$I = \frac{E_r}{R_r}$$

and the voltage across the RTD is $IR_r = E_r$.

From the specifications or by calibration, it is possible to obtain the temperature dependency of the reference resistance as a function of temperature:

$$R_r = R_c g(T)$$

From the specifications or by calibration, it is possible to obtain the temperature dependency of the sensing element as a function of temperature:

$$R_t = R_p f(T)$$

Then, Equation 8 below needs to be satisfied with measured voltage across the reference resistance, the voltage across the sensing element, the reference resistance $R_c$ at 20 degrees Celsius and the sensing element resistance $R_p$ at 20 degrees Celsius.

$$\frac{f(T)}{g(T)} = \frac{E_t}{E_r} \frac{R_c}{R_p} \quad \text{Equation 8}$$

The temperature in Equation 8 may be found numerically.

Applicant verified the above using simulation with the temperature sensor $R_t$ as platinum and the reference sensor $R_r$ as constantan. The resistances for both at 20 degrees Celsius were assumed as 100 ohms and 1V was applied to the circuit shown in FIG. 2C.

| | |
|---|---|
| Rc [ohm] | 100 |
| Rp [ohm] | 100 |
| C0 [1/° C.] | 0.00001 |
| C1 [1/° C.] | 3.56E-03 |
| C2 [1/° C.^2] | −6.18E-07 |
| E0 [V] | 1 |

Table 2 below shows the simulated results. The second column from the left shows the resistance of the reference sensor $R_r$, and the third column is the resistance of the temperature sensor $R_t$ for various temperatures. The current, voltages across sensors are also tabulated in the simulated outputs. The temperature calculation with uncompensated reference is 1.3 degrees Celsius different from the input temperature. The compensated temperature using Equation 7 reproduces the input temperature.

TABLE 2

| Temperature | Simulated outputs | | | | | Calculation | | Error |
|---|---|---|---|---|---|---|---|---|
| | Ref. Res. | Tmp. Res. | Current | Ref. Volt. | Tmp. Volt. | Measured | | |
| T [° C.] | Rr [ohm] | Rt [ohm] | I [A] | Er [V] | Et [V] | Tu [° C.] | Tc [° C.] | e2 [° C.] |
| −40 | 99.94 | 78.40 | 0.005607 | 0.560391 | 0.439609 | −39.87 | −40.00 | 0.13 |
| −20 | 99.96 | 85.65 | 0.005388 | 0.538551 | 0.461449 | −19.91 | −20.00 | 0.09 |
| 0 | 99.98 | 92.85 | 0.005186 | 0.51849 | 0.48151 | 0.05 | 0.00 | 0.05 |
| 20 | 100 | 100.00 | 0.005 | 0.5 | 0.5 | 20.00 | 20.00 | 0.00 |
| 40 | 100.02 | 107.10 | 0.004828 | 0.482906 | 0.517094 | 39.94 | 40.00 | −0.06 |
| 60 | 100.04 | 114.15 | 0.004669 | 0.467055 | 0.532945 | 59.87 | 60.00 | −0.13 |
| 80 | 100.06 | 121.16 | 0.00452 | 0.452319 | 0.547681 | 79.79 | 80.00 | −0.21 |
| 100 | 100.08 | 128.11 | 0.004382 | 0.438585 | 0.561415 | 99.70 | 100.00 | −0.30 |
| 120 | 100.1 | 135.01 | 0.004253 | 0.425755 | 0.574245 | 119.61 | 120.00 | −0.39 |
| 140 | 100.12 | 141.87 | 0.004132 | 0.413743 | 0.586257 | 139.50 | 140.00 | −0.50 |
| 160 | 100.14 | 148.67 | 0.004019 | 0.402475 | 0.597525 | 159.39 | 160.00 | −0.61 |
| 180 | 100.16 | 155.43 | 0.003913 | 0.391884 | 0.608116 | 179.26 | 180.00 | −0.74 |
| 200 | 100.18 | 162.13 | 0.003812 | 0.381913 | 0.618087 | 199.13 | 200.00 | −0.87 |
| 220 | 100.2 | 168.79 | 0.003718 | 0.372508 | 0.627492 | 218.98 | 220.00 | −1.02 |
| 240 | 100.22 | 175.39 | 0.003628 | 0.363624 | 0.636376 | 238.83 | 240.00 | −1.17 |
| 260 | 100.24 | 181.95 | 0.003544 | 0.355219 | 0.644781 | 258.67 | 260.00 | −1.33 |

Figure 5B:
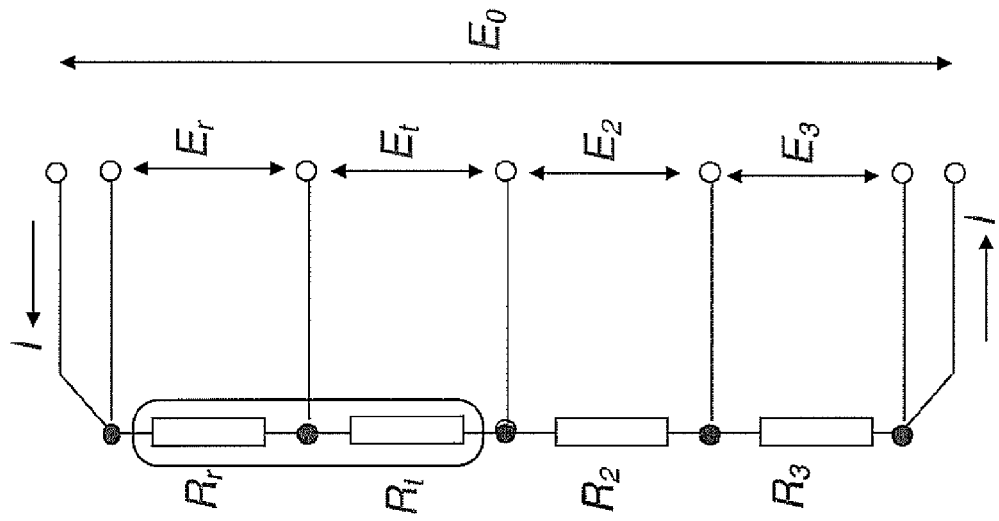
FIGS. 5A and 5B are schematic illustrations of some possible configurations for temperature measurements using multiple temperature transducers.
Figure 5A:
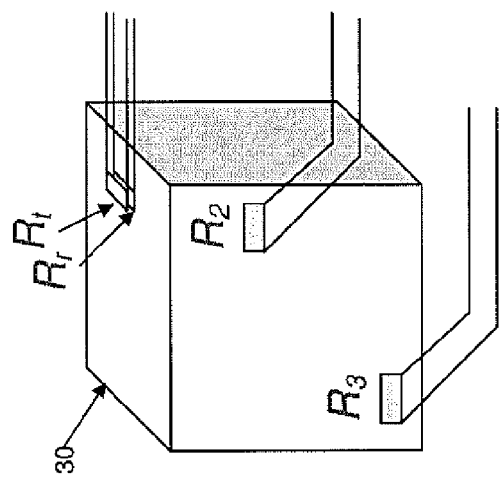

The principles discussed hereinabove may also be utilized for temperature measurements utilizing a plurality of temperature transducers $R_t$, $R_2$, $R_3$, as depicted in FIGS. 5A and 5B. The plurality of sensing temperature transducers may be arranged as desirable or necessary on a body 30 whose temperature needs to be measured at multiple locations or points. If multiple temperatures need to be measured, additional RTDs may be arranged in series as depicted in FIG. 5B.

As evident from FIG. 5B, serial current is delivered to the plurality of RTDs $R_t$, $R_2$, and $R_3$. In this, the current value is the same for all the sensing elements of FIG. 5B. Typically, current is separately supplied for each sensing element so that it is necessary to determine the current value for each sensing element. However, if current is supplied in series, only one value for the current needs to be determined for all the sensing elements.

The first RTD $R_t$ is placed together with the reference resistance $R_r$. Then the first temperature can be determined by Equation 7. From the known temperature, the reference RTD resistance $R_r$ is determined using Equation 2 above.

Then the current may be determined as:

$$I = \frac{E_r}{R_r} \qquad \text{Equation 9}$$

Each RTD resistance is then calculated as $$R_i = \frac{E_i}{I}$$

and each temperature is obtainable by solving $R_i = R_{pi}\{1 + C_1(\Delta T_i) + C_2(\Delta T_i)^2\}$.

The amount of current is the same for all RTDs $R_r$, $R_t$, $R_2$, $R_3$, and each RTD resistance and each temperature are then:

$$\Delta T_i = \frac{-C_1 + \sqrt{C_1^2 - 4C_2\left(1 - \frac{R_i}{R_{pi}}\right)}}{2C_2} \qquad \text{Equation 10}$$

Since, as previously discussed above, different metallic wires are connected to perform the temperature measurements, there may be thermoelectric effects to generate voltage. The induced voltage can also affect the resistance measurements and cause errors in the temperature sensing. To evaluate such thermo-electric effects, the polarity of the current may be flipped.

Figure 6A:
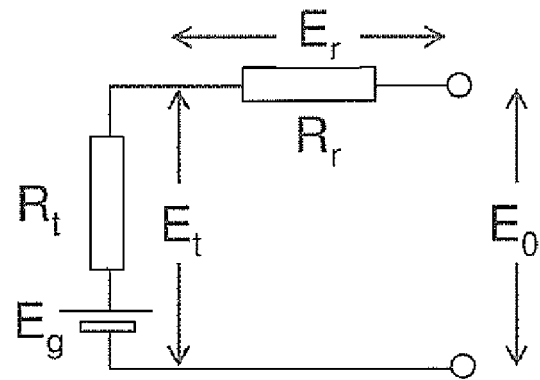
FIGS. 6A and 6B are circuit diagrams for illustrating thermoelectric principles discussed in the present disclosure.

Assume that the voltage generated by the thermal-electric effects is $E_g$ as shown in FIG. 6A. The current that flows into the temperature sensing wire $R_t$ is measured across the reference resistor $E_r$. Then the current I and voltage to be observed are:

$$IR_r = E_r \qquad \text{Equation 11}$$

$$IR_t + E_g = E_t \qquad \text{Equation 12}$$

$$E_r \frac{R_t}{R_r} + E_g = E_t \qquad \text{Equation 13}$$

Rewrite Equation 13 for two different voltages to be applied.

$$E_{r1} \frac{R_t}{R_r} + E_g = E_{t1} \qquad \text{Equation 14}$$

$$E_{r2} \frac{R_t}{R_r} + E_g = E_{t2} \qquad \text{Equation 15}$$

Then $R_t$ may be found as:

$$R_t = \frac{E_{t1} - E_{t2}}{E_{r1} - E_{r2}} R_r \qquad \text{Equation 16}$$

The polarity of supply voltage does not have to be swapped and $R_t$ can be obtained by using two different voltages.

Figure 6B:
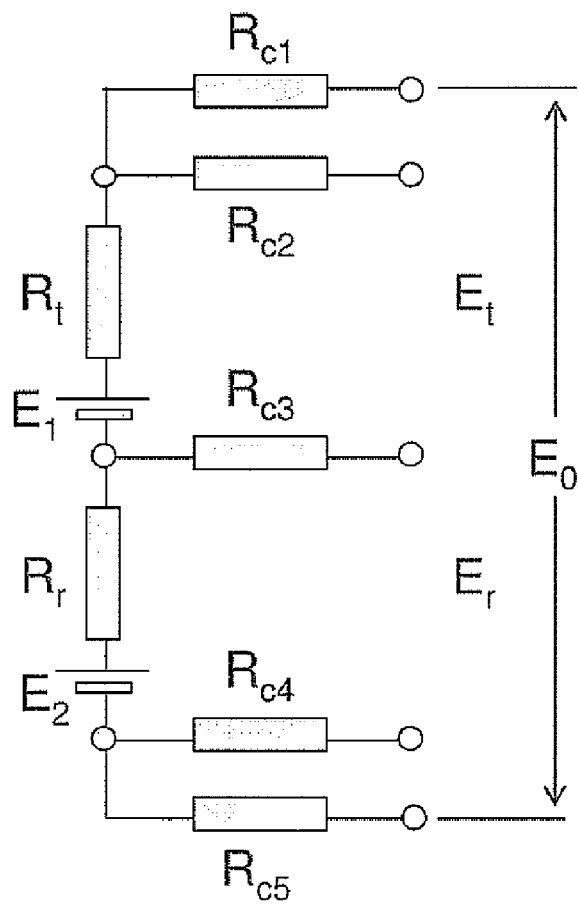

The above may be expanded for a 5-wire system, as depicted in FIG. 4B, where the reference resistance $R_r$ is attached to the sensing element $R_t$. There may be two batteries for thermoelectric modeling, as shown in FIG. 6B. The battery terms are included in both the reference and the sensing equations.

$$IR_r + E_1 = E_r \qquad \text{Equation 17}$$

$$IR_t + E_2 = E_t \qquad \text{Equation 18}$$

Combining Equations 17 and 18 yields:

$$(E_r - E_1) \frac{R_t}{R_r} = (E_t - E_2) \qquad \text{Equation 19}$$

Rewriting Equation 19 for two supply voltages:

$$(E_{r1} - E_1) \frac{R_t}{R_r} = (E_{t1} - E_2) \qquad \text{Equation 20}$$

$$(E_{r2} - E_1) \frac{R_t}{R_r} = (E_{t2} - E_2) \qquad \text{Equation 21}$$

where $E_{r1}$ and $E_{t1}$, are the voltages measured for the first current injection and $E_{r2}$ and $E_{t2}$ are for the second current injection.

Solving $R_t$ in Equations 20 and 21 yields an expression for $R_t$ in terms of the measured voltages in the first and second current injections.

$$R_t = \frac{E_{t1} - E_{t2}}{E_{r1} - E_{r2}} R_r \qquad \text{Equation 22}$$

Equation 22 happens to be the same as Equation 16.

The measurement errors associated with, for example, platinum resistance temperature measurements are that the current injection to the platinum wire generates heat and changes the temperature of the platinum wire. If the media where the temperatures are of interest has large heat capacity, the heat dissipation is absorbed by the media and temperature increase may be insignificant. If the media has small heat capacity, such as air, the heat dissipation increases the temperature of the sensor and the sensor temperature does not represent the temperature of the media.

Figure 7A:
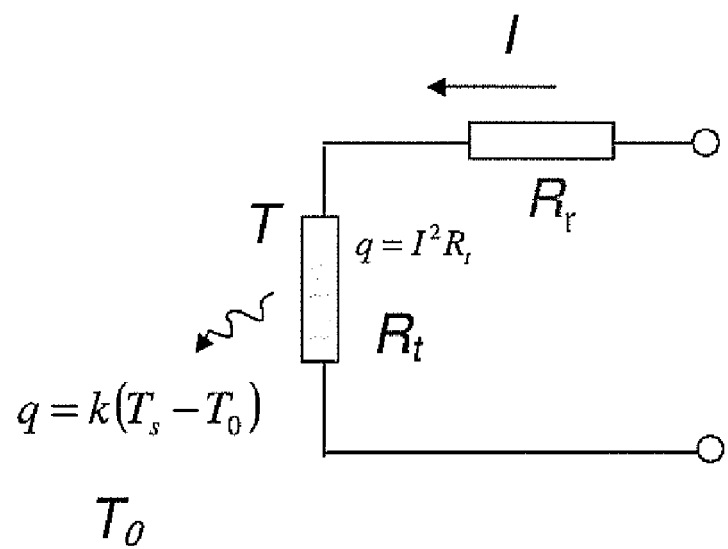
FIG. 7A is a circuit diagram for explaining heat dissipation principles discussed in the present disclosure and FIG. 7B is a flowchart depicting one method of compensating for heating effects according to the present disclosure.
Figure 7B:
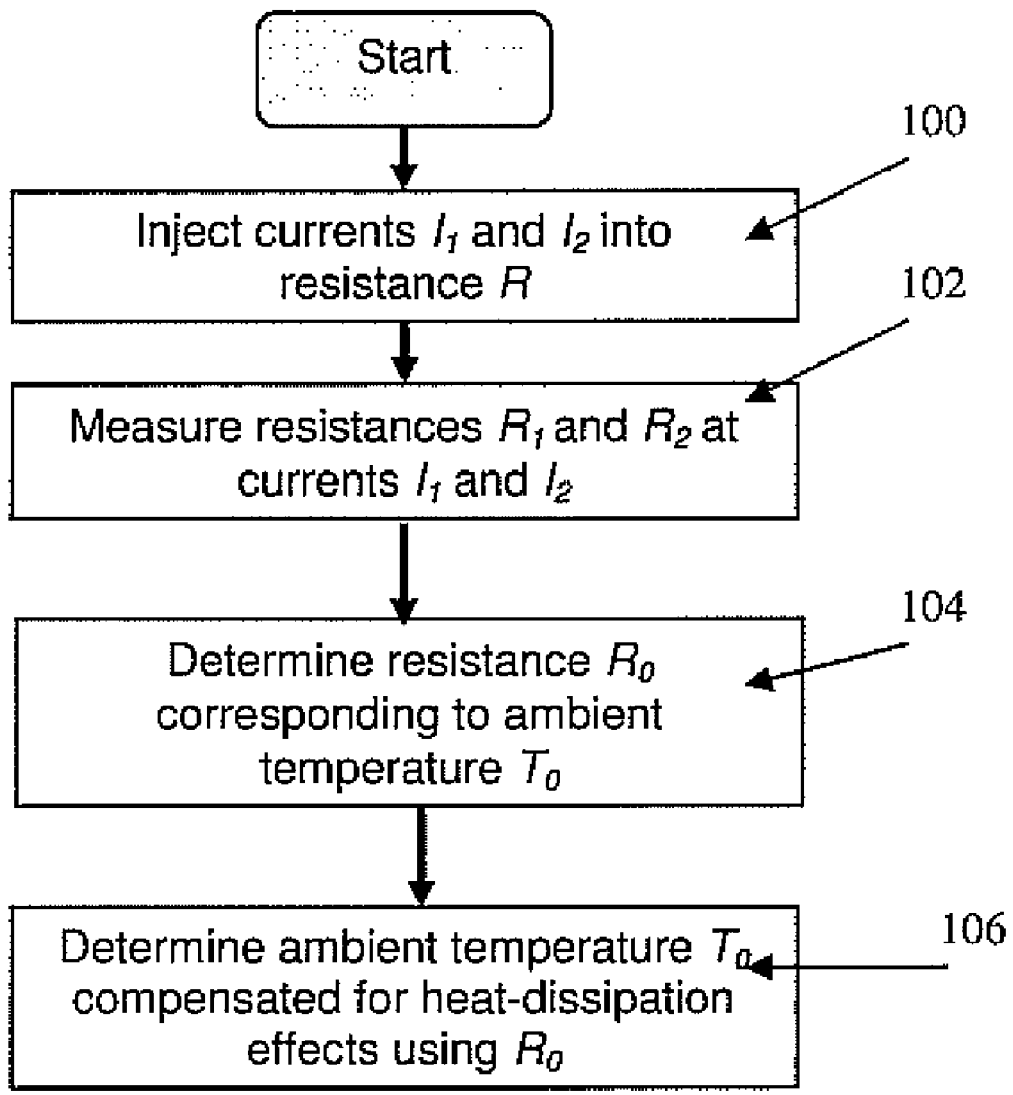

FIG. 7A is a schematic representation of heat dissipation effects in a thermal resistor temperature transducer. FIG. 7B depicts the steps of one method for compensating for heating effects such as self-heating and heat dissipation according to the principles of the present disclosure. To evaluate such self heating effects, two different currents $I_1$ and $I_2$, for example, 1 mA and 1.4 mA, may be injected into the thermal resistor transducer R (Note Step 100 in FIG. 7B). If the heat generation is negligible for the temperature measurement, the RTD resistance measured with 1 mA current should be the same as the RTD resistance measured by 1.4 mA current (Note Step 102 in FIG. 7B).

In temperature measurement cases where the thermal conduction/convection is small, the heat dissipation from the RTD is accumulated in the RTD and the temperature of the RTD increases. As a consequence, the RTD resistance is changed depending on the amount of the current injection.

The present disclosure provides compensation for self-heating and heat generation effects by estimating heat transfer. The current I flowing in a resistance $R_t$ generates heat $q=I^2R_t$. The heat convection and/or conduction from a surface to a media is $q=k(T_s-T_0)$, where k the overall heat transfer coefficient; $T_s$ is the temperature of the sensor heated by the current; and $T_0$ is the temperature of the environment. All the generated heat is dissipated by convection into the surrounding media when the temperature reaches equilibrium. Then the thermal balances for current $I_1$ and $I_2$, by assuming k stays the same for the two measurements, are written as:

$$I_1^2 R_{t1} = k(T_{s1} - T_0) \quad \text{Equation 23}$$

$$I_2^2 R_{t2} = k(T_{s2} - T_0) \quad \text{Equation 24}$$

The resistance $R_{t1}$ and $R_{t2}$ at $T_{s1}$ and $T_{s2}$ for current $I_1$ and $I_2$ are estimated by using the first order temperature coefficient α:

$$R_{t1} = R_0\{1 + \alpha(T_{s1} - T_0)\} \quad \text{Equation 25}$$

$$R_{t2} = R_0\{1 + \alpha(T_{s2} - T_0)\} \quad \text{Equation 26}$$

Since the temperature difference between the RTD and ambient is small, the first order resistance estimation is valid. Then $R_0$ at $T_0$ may be found as:

$$R_0 = \frac{R_{t1} R_{t2}(I_2^2 - I_1^2)}{I_2^2 R_{t2} - I_1^2 R_{t1}} \quad \text{Equation 27}$$

Note Step 104 in FIG. 7B. The currents flowing into the RTD are:

$$I_1 = \frac{E_{r1}}{R_r}$$

$$I_2 = \frac{E_{r2}}{R_r}$$

Since, the resistances of the RTD are:

$$R_{t1} = \frac{E_{t1}}{I_1},$$

$$R_{t2} = \frac{E_{t2}}{I_2}$$

the resistances of the RTD are determined by the measured voltages across the reference resistance and the RTD as:

$$R_{t1} = \frac{E_{t1}}{E_{r1}} R_r$$

$$R_{t2} = \frac{E_{t2}}{E_{r2}} R_r$$

Then the resistance at ambient temperature may be written by using measured voltages $$R_0 = \frac{E_{t1} E_{t2}(E_{r2}^2 - E_{r1}^2)}{E_{r1} E_{r2}(E_{r2} E_{t2} - E_{r1} E_{t1})} R_r$$

Once the RTD resistance is determined, the ambient temperature is determined by using Equation 1 (Note Step 106 in FIG. 7B). It should be noted that the injected current should be as small as possible to minimize self-heating, and the self-heating effects should be subtracted from the measured temperature for better accuracy.

In summary, the present disclosure provides novel methodologies in which a reference resistance is combined with a temperature sensing resistance, and the two resistances are packaged together so as to be maintained at the same temperature. The present disclosure provides novel arrangements for RTD elements. In this, a 5-wire arrangement proposed herein produces accurate results by ignoring the cable wire resistance. In addition, the techniques disclosed herein compensate for dissipation of heat.

Figure 8A:
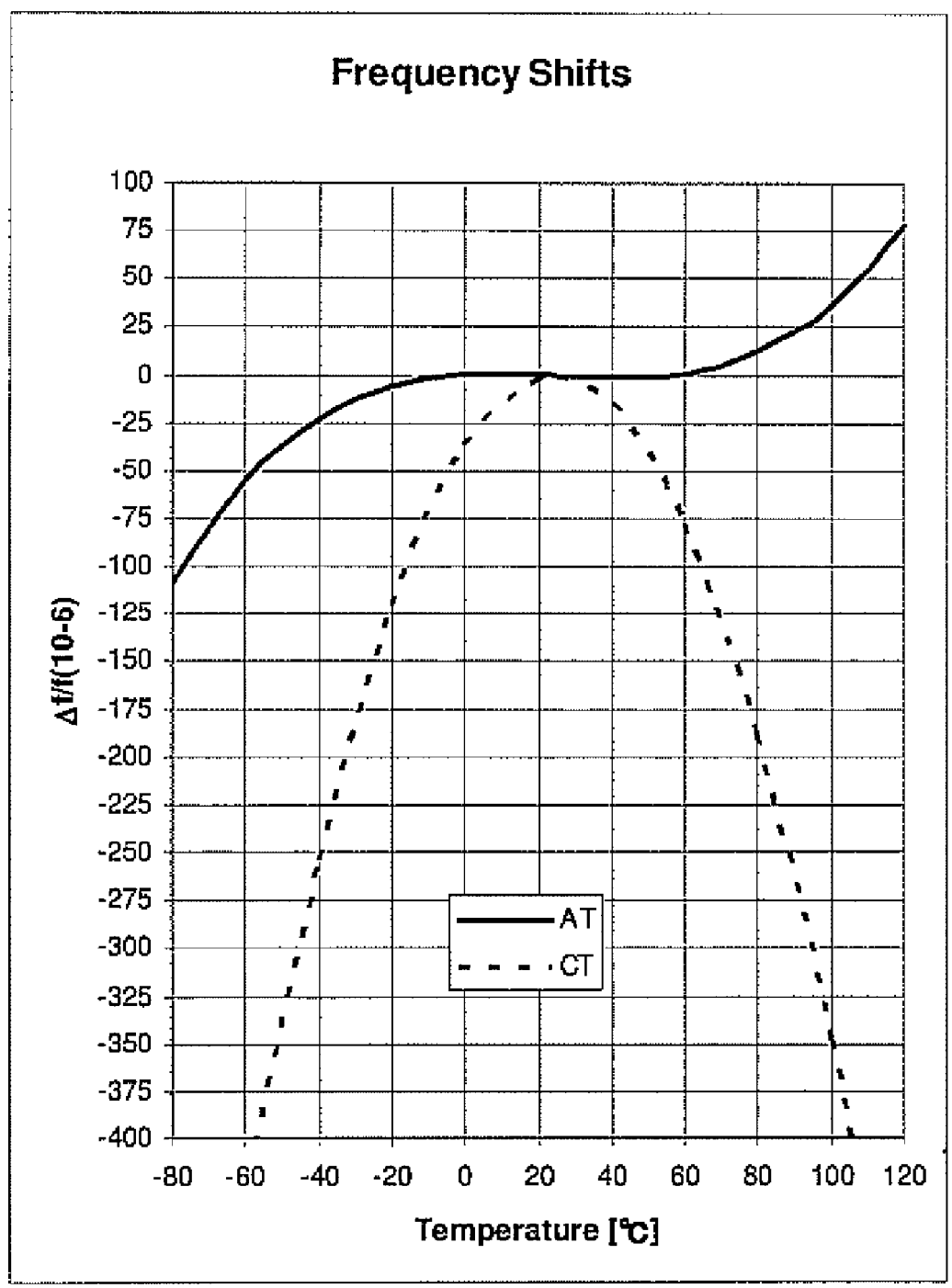
FIGS. 8A to 8D illustrate the principles for quartz crystal temperature gauges according to the present disclosure.
Figure 8B:
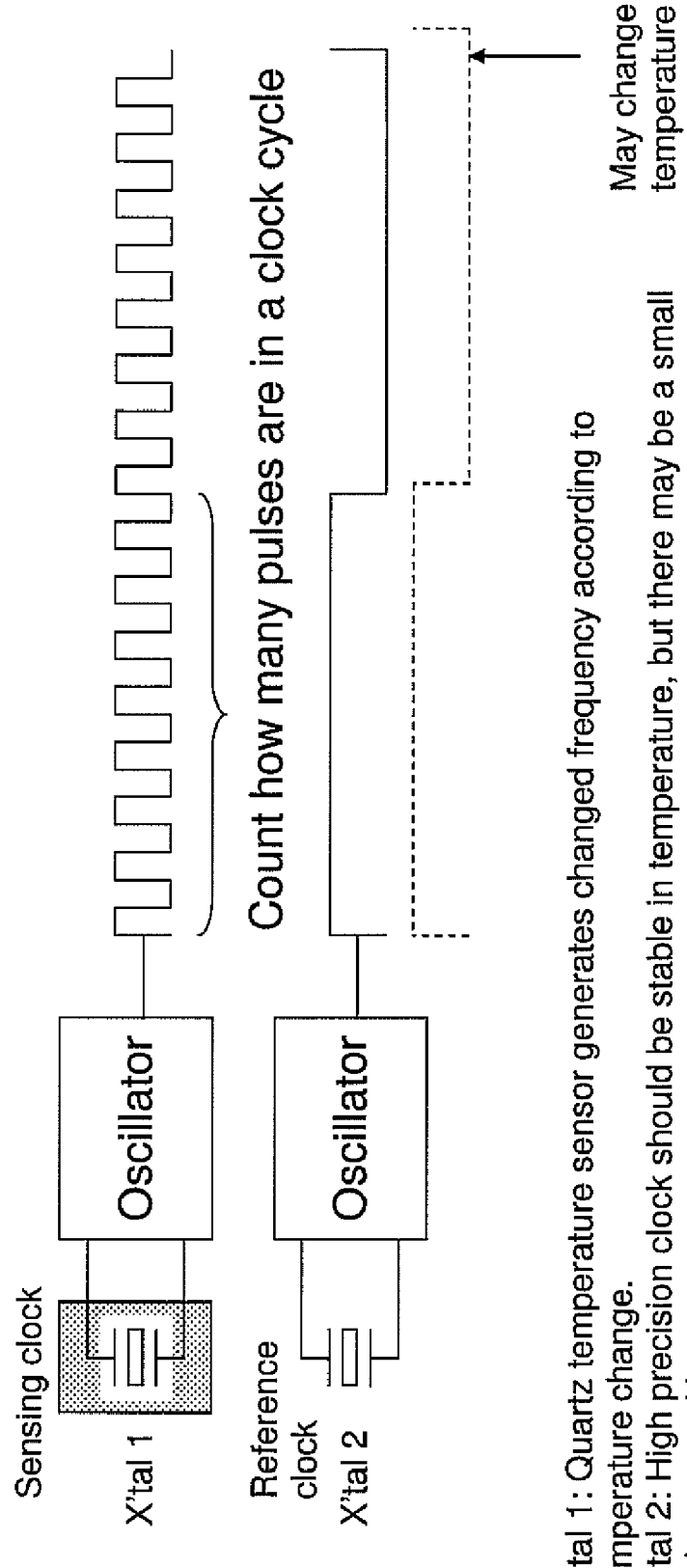
Figure 8C:
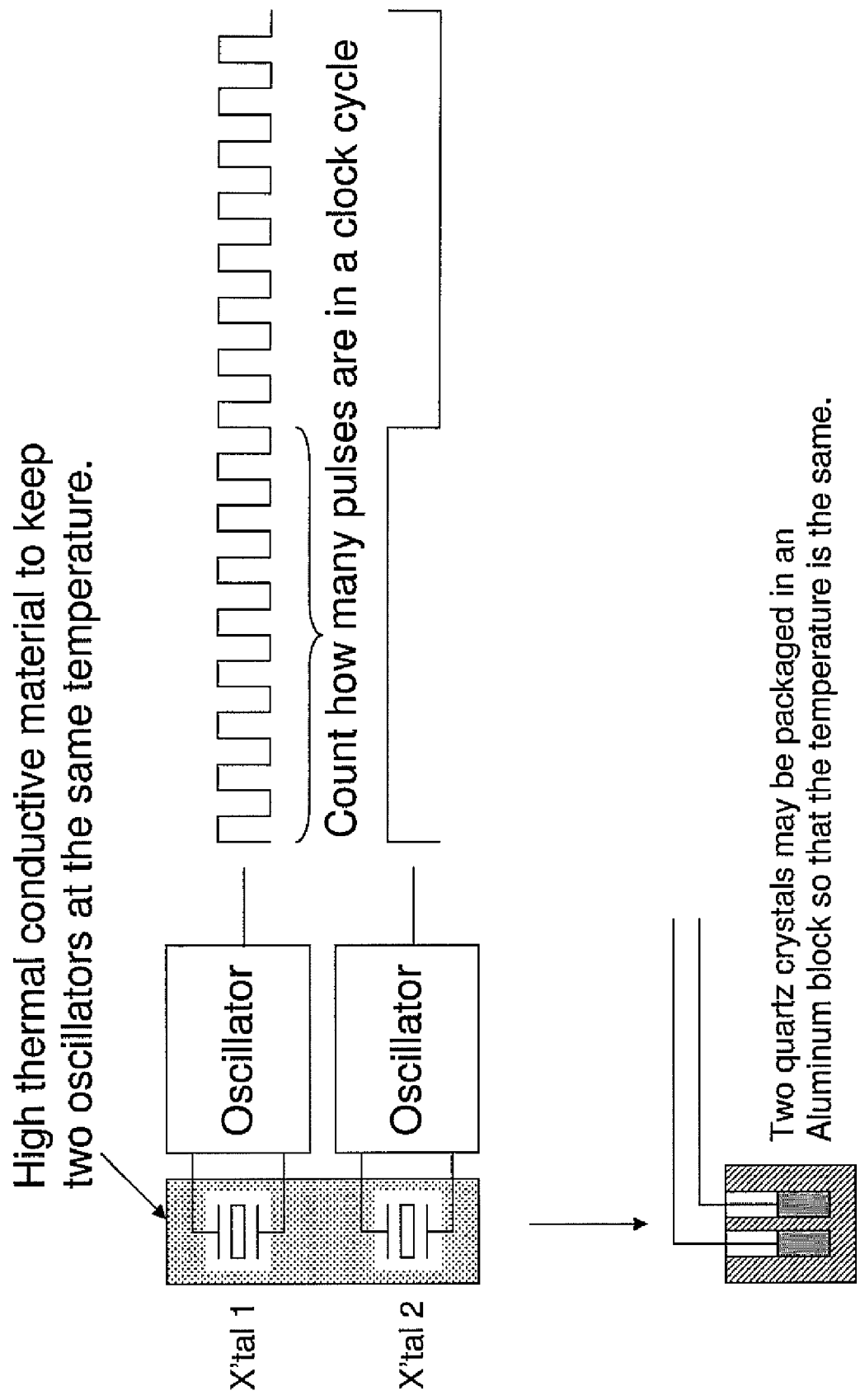

FIGS. 8A to 8D illustrate the principles for some quartz crystal temperature gauges according to the present disclosure. In FIG. 8A, the temperature dependency of the resonant frequencies of quartz crystals having two types of cuts, AT and CT, is shown. FIG. 8B shows how two quartz crystals having different temperature dependencies may be used in a quartz temperature gauge. As depicted in FIG. 8B, although Crystal 2 is a high precision clock that is stable when the ambient temperature changes, there may be some change in the resonant frequency of the reference clock due to temperature which causes errors in the temperature measurements. The present disclosure provides an improved quartz temperature gauge, as depicted in FIG. 8C, which compensates for any changes in the reference clock due to temperature effects.

Figure 8D:
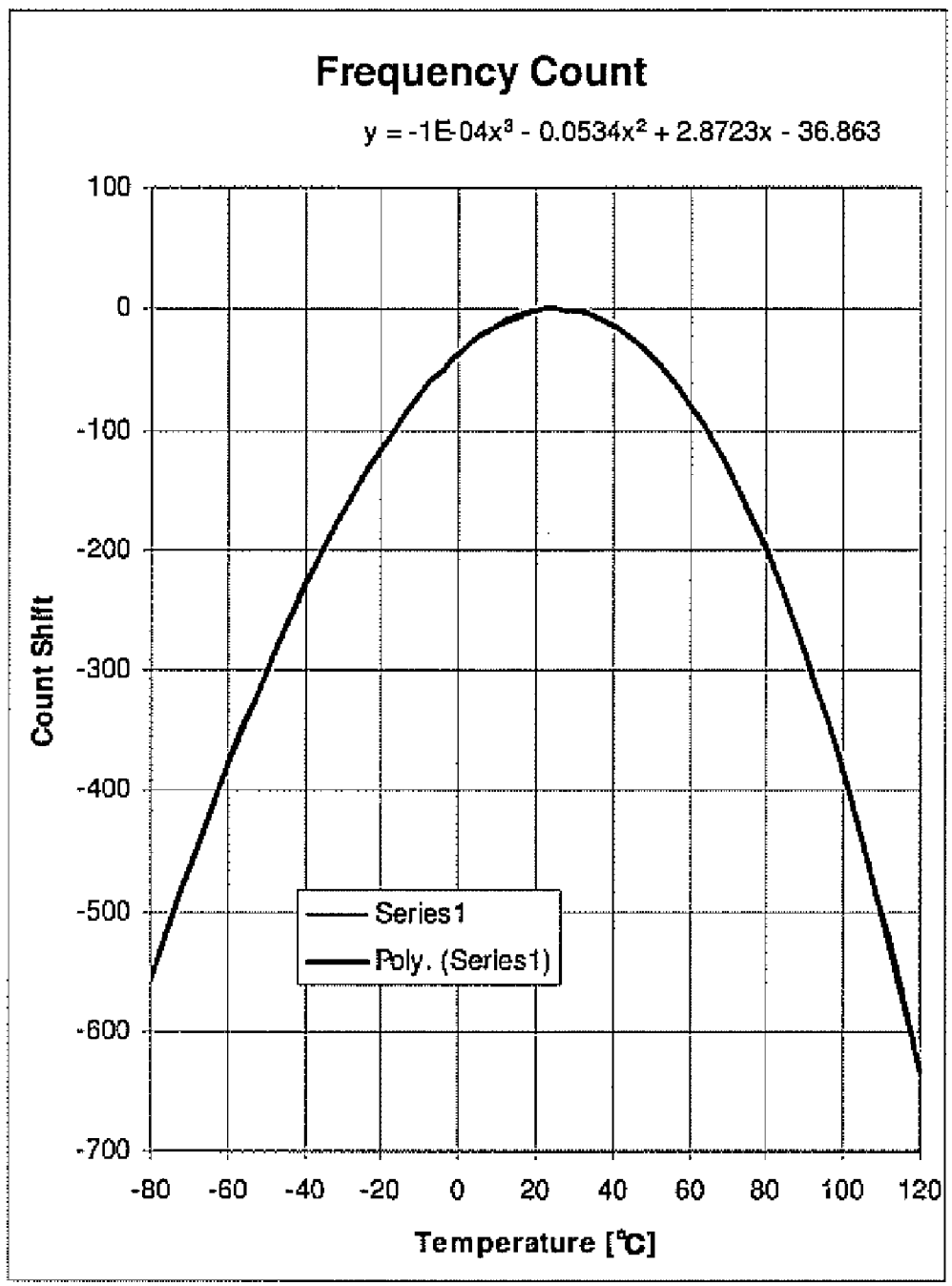

FIG. 8D is a graph depicting one method for temperature compensation of temperature measurements by quartz crystal temperature gauges. The simulation of FIG. 8D is made based on the temperature dependency chart of FIG. 8A. The temperature sensing clock (Crystal 1) changes frequency and the is window made by the reference clock (Crystal 2) causes small change. Note again FIG. 8B. If it is known that temperatures above 25 degrees Celsius are to be measured, then it is possible to tell the temperature from the given clock count. In this, 1 MHz is counted for the CT-cut temperature sensing clock (Crystal 1) for 1 s by the AT-cut reference clock (Crystal 2) and 1000000 is subtracted.

Figure 9:
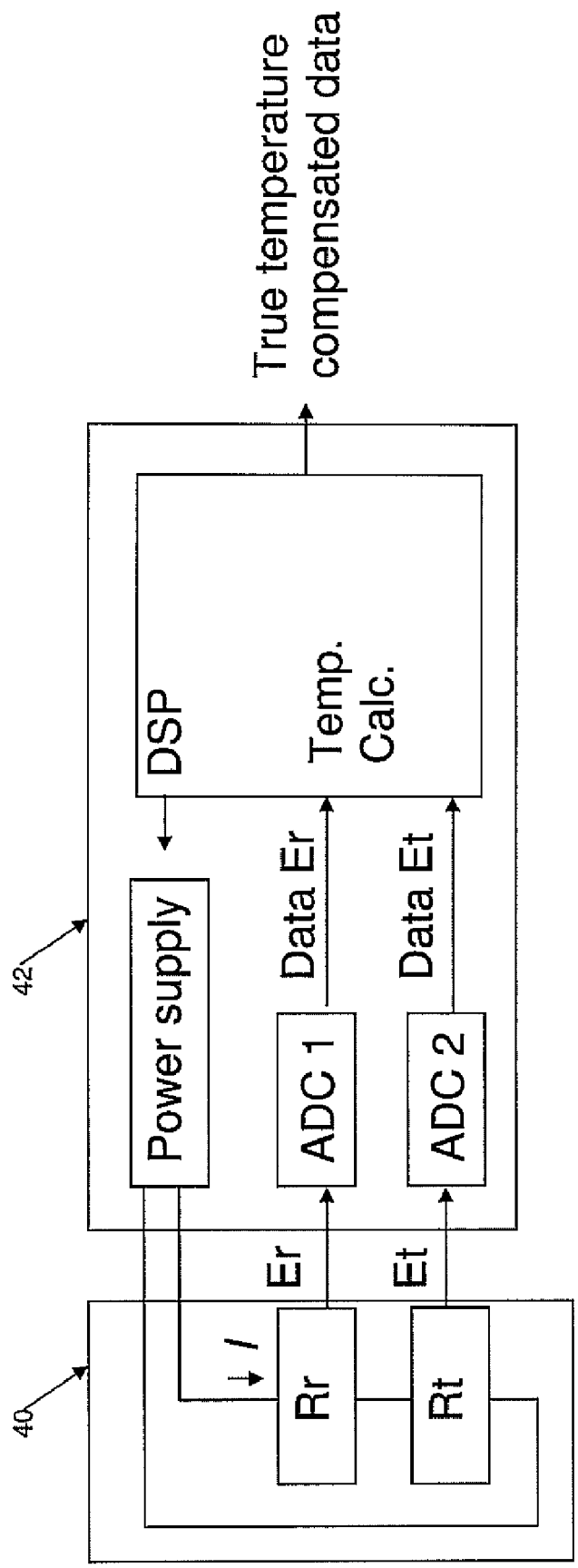
FIG. 9 is a schematic representation of one possible technique for temperature compensation of temperature measurements according to the principles described herein.

FIG. 9 is a schematic representation of one possible technique for temperature compensation of temperature measurements according to the principles described herein. A sensing element 40 (note also FIG. 4E) is connected with a controller 42. The controller 42 may be configured or designed according to the principles described herein. For example, a power supply is connected with the sensing element 40 to provide current across the reference resistance $R_r$ and the sensing resistance $R_r$. Voltage across the transducers are measured and a temperature calculation module derives the temperature compensated data according to the principles described herein.

Figure 10A:
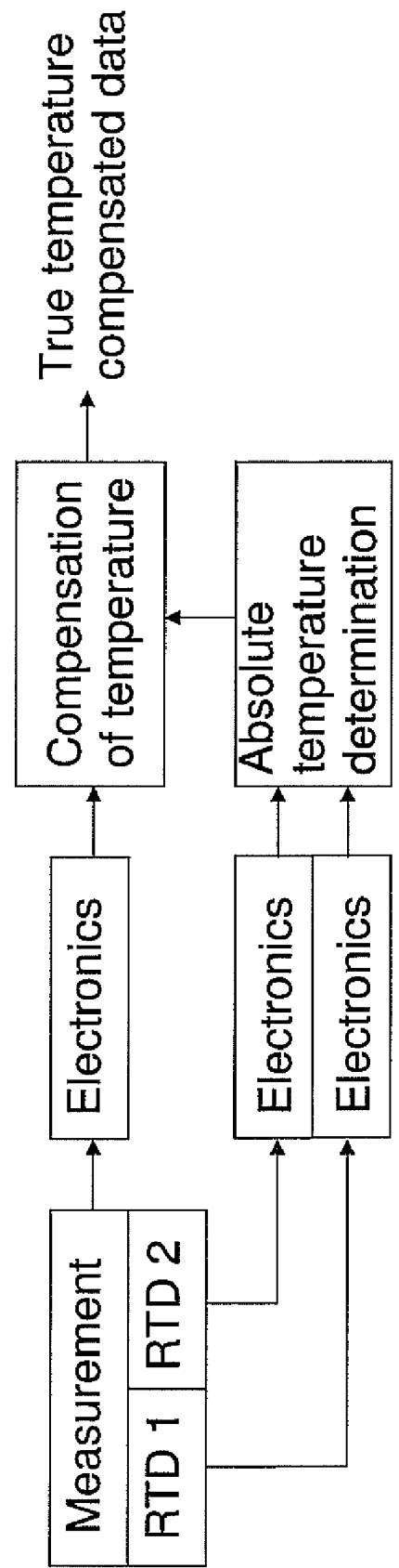
FIG. 10A is a schematic representation of one possible method and system for temperature compensation of measurements other than temperature according to the principles described herein.
Figure 10B:
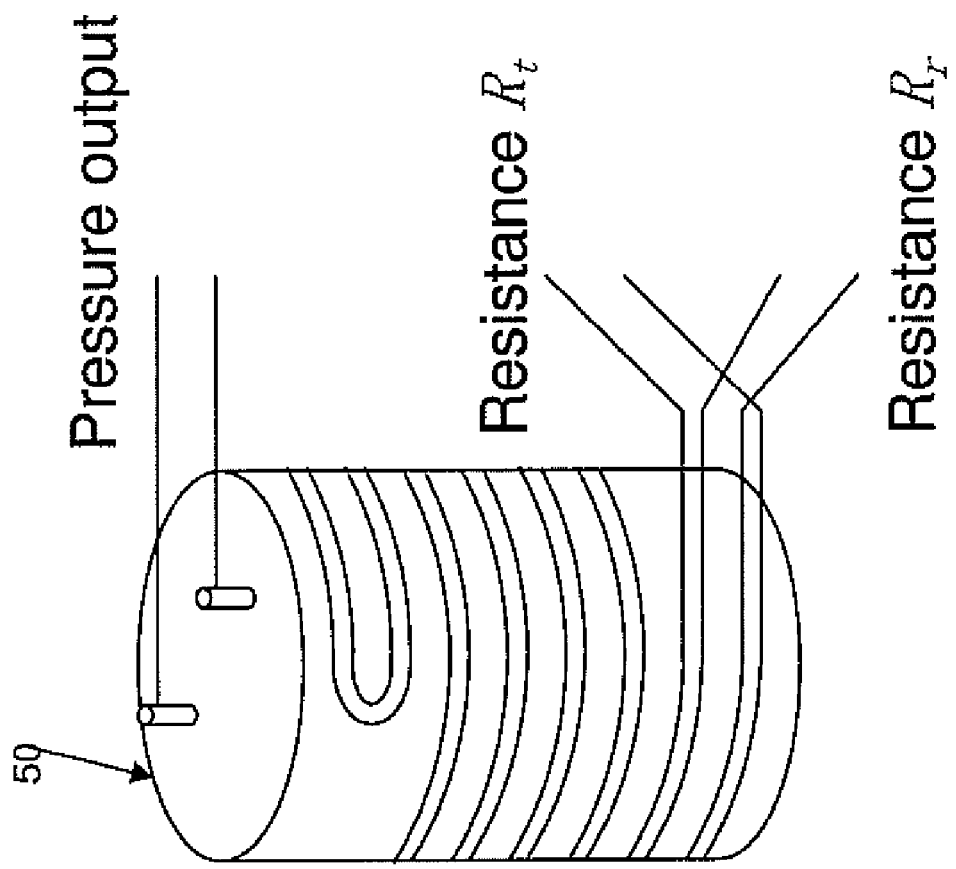
FIG. 10B is a schematic representation of an exemplary pressure-temperature gauge with a temperature transducer according to the principles described herein.

FIG. 10A is a schematic representation of one possible method and system for temperature compensated measurements other than temperature measurements and FIG. 10B is an exemplary pressure-temperature gauge 50 with a temperature transducer (note, for example, FIG. 4E) according to the principles described herein.

The embodiments and aspects were chosen and described in order to best explain the principles of the invention and its practical applications. The preceding description is intended to enable others skilled in the art to best utilize the principles described herein in various embodiments and with various modifications as are suited to the particular use contemplated. It is intended that the scope of the invention be defined by the following claims.

What is claimed is:

1. A method for compensating temperature measurements by a temperature gauge, comprising:
   providing a first temperature sensor and a second reference temperature sensor in a temperature gauge, wherein
      the first and second temperature sensors comprise resistance temperature detectors (RTD) and have different thermal properties; and
      the temperature gauge is configured or designed so that the first and second temperature sensors are located in the same ambient temperature;
   measuring at least one temperature value simultaneously by the first and second temperature sensors of the temperature gauge; and
   deriving one or more compensated temperature values based on the measured temperature value and the thermal properties of the first and second temperature sensors.

2. The method according to claim 1, wherein the first resistance temperature detector comprises platinum and the second reference resistance temperature detector comprises constantan.

3. The method according to claim 1, wherein the first and second temperature sensors comprise platinum wire and constantan wire imbedded in electrically insulated film substrate.

4. The method according to claim 1, wherein the first and second temperature sensors are attached to a surface of a pressure gauge.

5. The method according to claim 1, wherein the temperature gauge is configured or designed for operating in oil wells.

6. The method according to claim 1, wherein the temperature gauge is configured or designed for operating in locations where ambient room temperature environment is unavailable.

7. A system for temperature measurements by a temperature gauge, comprising:
   a first temperature sensor and a second temperature sensor in a temperature gauge, wherein
      the first and second temperature sensors comprise resistance temperature detectors (RTD) and have different thermal properties; and
      the temperature gauge is configured or designed so that the first and second temperature sensors are located in the same ambient temperature to be measured;
   a computer in communication with the temperature gauge; and
   a set of instructions that, when executed:
      derive at least one compensated temperature value based on at least one temperature value, measured simultaneously by the first and second temperature sensors of the temperature gauge, and the thermal properties of the first and second temperature sensors.

8. The system according to claim 7, wherein the first resistance temperature detector comprises platinum and the second reference resistance temperature detector comprises constantan.

9. The system according to claim 7, wherein the first and second temperature sensors comprise platinum wire and constantan wire imbedded in an electrically insulated film substrate.

10. The system according to claim 7, wherein the first and second temperature sensors are attached to a surface of a pressure gauge.

11. The system according to claim 7, wherein the temperature gauge is configured or designed for operating in oil wells.

12. The system according to claim 7, wherein the temperature gauge is configured or designed for precision temperature measurements in environments where ambient room temperature environment is unavailable.

13. A temperature gauge, comprising:
   a first temperature sensor and a second reference temperature sensor, wherein
      the first and second temperature sensors comprise resistance temperature detectors (RTD) and have different thermal properties; and
      the temperature gauge is configured or designed so that the first and second temperature sensors are located in the same ambient temperature to be measured by said temperature sensors.

14. The temperature gauge according to claim 13, wherein the first and second temperature sensors comprise platinum wire and constantan wire imbedded in an electrically insulated film substrate.

15. The temperature gauge according to claim 13, wherein the first temperature sensor is a plurality of first temperature sensors; and
   the temperature gauge is configured or designed for sensing temperature at a plurality of locations on a body.

16. The temperature gauge according to claim 13, wherein the temperature gauge is configured or designed for precision temperature measurements in environments where ambient room temperature environment is unavailable.

17. A system for temperature measurements, comprising:
   a plurality of first temperature sensors and a second reference temperature sensor, wherein
      the first and second temperature sensors have different thermal properties and are configured or designed so that at least one of the first temperature sensors and the second reference temperature sensor are located in the same ambient temperature;
   an electrical circuit connected in series with the first and second temperature sensors such that the same current is input into the first and second temperature sensors;
   a computer in communication with the first and second temperature sensors; and
   a set of instructions that, when executed:
      derive at least one compensated temperature value based on at least one temperature value, measure simultaneously by the at least one first temperature sensor and the second reference temperature sensor, and the thermal properties of the first and second temperature sensors.

* * * * *